United States Patent [19]

Asprey

[11] Patent Number: 5,323,420
[45] Date of Patent: Jun. 21, 1994

[54] CIRCUITRY FOR REGENERATING DIGITAL SIGNALS IN EXTENDED DISTANCE COMMUNICATIONS SYSTEMS

[75] Inventor: Robert R. Asprey, Harvest, Ala.

[73] Assignee: Cybex Corporation, Huntsville, Ala.

[21] Appl. No.: 736,568

[22] Filed: Jul. 26, 1991

[51] Int. Cl.⁵ .............................. H03K 5/153
[52] U.S. Cl. .......................... 375/4; 375/36; 333/33; 307/354; 307/363; 345/1
[58] Field of Search ............... 375/3, 4, 36, 60, 71; 340/717; 178/63 A, 63 E, 71 R; 333/24 R, 32, 33; 307/307, 328, 354, 363

[56] References Cited

U.S. PATENT DOCUMENTS

| | | | |
|---|---|---|---|
| 4,068,138 | 1/1978 | Miyakawa et al. | 307/354 |
| 4,169,232 | 9/1979 | Henrich | 307/354 |
| 4,644,293 | 2/1987 | Kenneth | 375/71 |
| 4,885,718 | 12/1989 | Asprey et al. | 375/36 |
| 4,890,065 | 12/1989 | Laletin | 307/363 |
| 5,019,722 | 5/1991 | Hess et al. | 307/354 |

Primary Examiner—Stephen Chin
Assistant Examiner—Young Tse
Attorney, Agent, or Firm—Phillips & Beumer

[57] ABSTRACT

A regeneration circuit (16) is disclosed for regenerating noisy, received digital signals in a high impedance signal line (22). A buffer amplifier (30) is provided with a feedback resistor (36), with the feedback resistor and input to the buffer amplifier coupled to line (22) and to a pull-up resistor (34). The values of resistors (34 and 36) are selected such that when a normally "high" logic potential on line (22) is pulled "low" and then released, the buffer amplifier functions to source current to line (22) during the falling transition; and after the amplifier transitions "low," it sinks current from line (22). Thus, buffer amplifier (30) acts first as a pull-up device during the falling transition and then as a pull-down device during the rising transition. This restores the received logic signals to digital levels and reduces noise about the switching points in the rising and falling transitions.

13 Claims, 5 Drawing Sheets

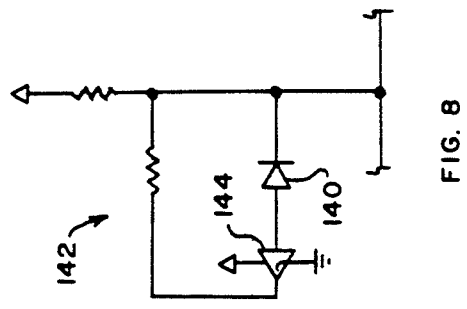
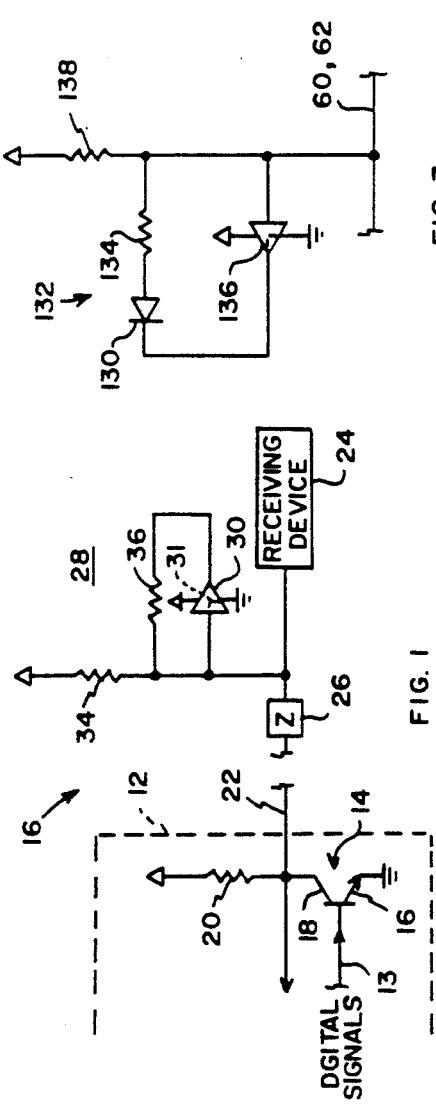
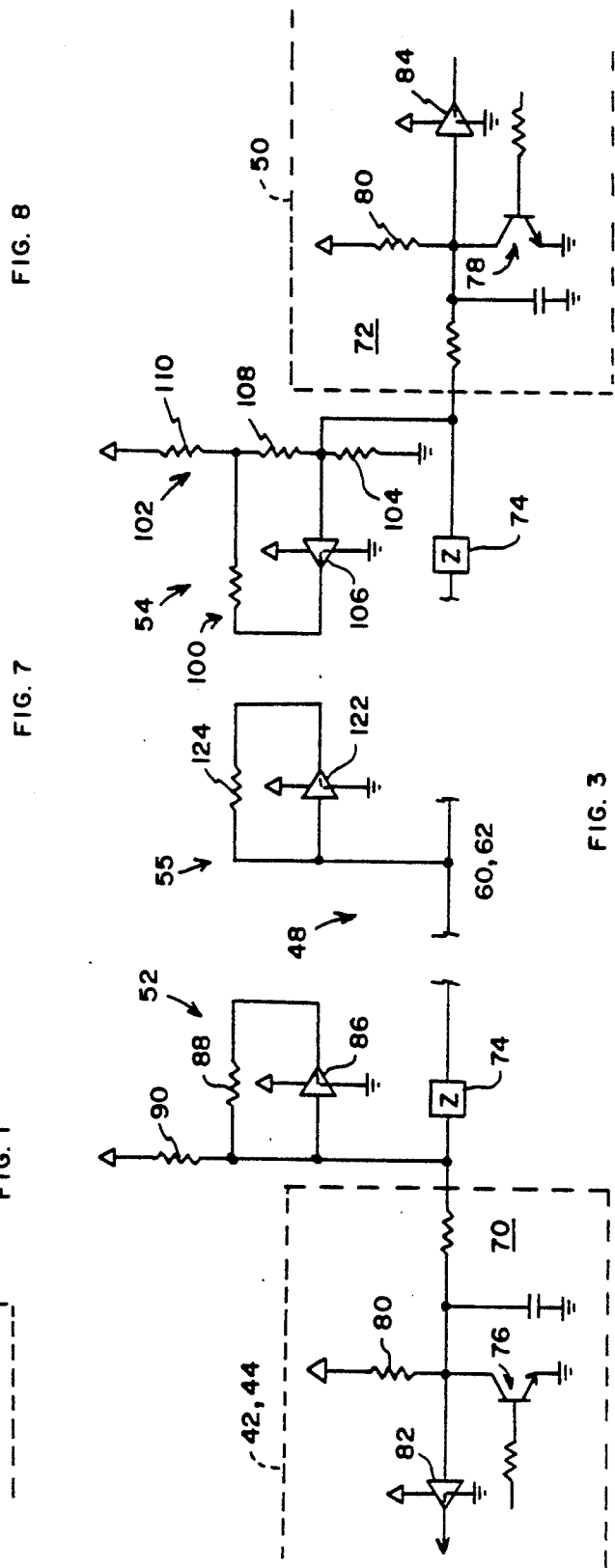

CIRCUITRY FOR REGENERATING DIGITAL SIGNALS IN EXTENDED DISTANCE COMMUNICATIONS SYSTEMS

FIELD OF THE INVENTION

This invention relates generally to regenerating digital signals in extended distance communications systems for computer components and particularly to circuitry for reducing noise and reconstructing voltage levels and rise and fall times of digital signals on an extended-in-length signal line.

BACKGROUND OF THE INVENTION

There exists a number of situations wherein it is desirable to perform computer operations a distance from the computer, as in factory environments, laboratory environments, and retail environments. In these situations, the computer is typically located a distance from the keyboard and monitor, possibly in a more hospitable environment than a factory or laboratory setting. In such situations, it is sometimes desirable to operate a "mouse," or X-Y transducer, in conjunction with a keyboard and video monitor located a remote distance from the computer. Ideally, these components are coupled to the computer by a single, conventional cable having a plurality of insulated conductors. However, with long conductors, signal attenuation by the conductors and roll-off filters increases rise and fall times and reduces signal swing of digital signals to a point where the received signals will not reliably trigger digital devices in the mouse and keyboard and the computer to which they are connected. Also, the "mouse," providing much higher pulse rates than a keyboard, and in some cases presenting signals with less drive capability to the computer, is more sensitive to signal degradation due to length of the conductors in the cable and the RC roll-off filters generally used to reduce radiated interference as per FCC requirements. Further, in cases where video signals are present, noise due to induced crosstalk in the mouse signal lines from video conductors in the cable causes erroneous mouse signals. Further, induced video noise in the keyboard clock and data conductors may also result in erroneous or spurious data bits in the keyboard or computer.

Still further, problems occasionally occur where voltage offsets in the ground potential between the computer and peripheral components are experienced. Here, this offset may be so great that in some digital systems, particularly those utilizing TTL devices, the offset voltage may be high enough to prevent the TTL devices from transitioning to a "low" logic level.

Attempts by some to overcome these problems have involved filtering or capacitively shunting video noise to a stable potential, such as ground, and using threshold devices, such as Schmitt-triggered devices, to provide hysteresis in attempts to eliminate noise. Others, believing it to be impossible to couple digital signals in a single, conventional cable having a plurality of conductors more than a limited distance, such as more than a few dozen feet, have simply given up.

The applicant has devised extended computer communications systems for coupling keyboards and monitors remote distances from a computer, such as illustrated in U.S. Pat. No. 4,855,718, issued on Dec. 5, 1989, to Asprey et al. Further, applications relating to extending computer communications, and which may be significant to the instant application, are patent application Ser. No. 07/597,544, filed on Oct. 12, 1990, by Robert R. Asprey, which is a continuation-in-part of patent application Ser. No. 07/447,010, filed on Dec. 5, 1989, by Robert R. Asprey, which is a continuation-in-part of patent application Ser. No. 07/095,140, filed on Sep. 11, 1987, by Asprey et al., issued as U.S. Pat. No. 4,885,718.

Additional applications that may be significant to the instant application are patent application Ser. No. 07/488,710, filed on Mar. 5, 1990, by Asprey et al., which is a continuation-in-part of above-referenced patent application Ser. No. 07/447,010, and patent application Ser. No. 07/555,580, filed on Jul. 19, 1990, by Asprey et al.

Patent application Ser. No. 07/597,544 is directed to splitting analog color video signals and providing color video signals to an analog color monitor located near a computer and providing analog monochrome video signals to a remotely located analog monochrome monitor. This circuitry utilizes a pair of transistors having base inputs coupled in parallel to split the video signal and an attenuation network to attenuate the signal prior to applying the signal to an extended cable to the monochrome signal conditioning network. No suggestion is made herein to actively pull up or pull down a voltage potential while providing increased noise damping at switching thresholds.

U.S. Pat. No. 4,855,718 discloses an extended range communications link for coupling a computer up to 300 feet from a monochrome monitor and keyboard and up to 150 feet for a color monitor and keyboard. This separation is accomplished by a conventional cable having signal conditioners at each end thereof which comprise capacitors coupled between the clock and data lines and ground and a positive power source. These capacitors function to shunt high frequency noise to ground and stabilize the power supply voltage. The video signals, at the computer, are each coupled to a discrete TTL buffer amplifier, which powers the video signals through the extended cable. Capacitors coupled to outputs of the video buffer amplifiers serve to reduce radiated noise using passive pull-up for keyboard clock and data inputs at the end of the extended cable. No suggestion is made in this patent to provide a circuit which serves to actively pull up or pull down highly attenuated keyboard clock and data signals received from the extended cable while providing increased noise damping at and near the switching threshold.

Patent application Ser. No. 07/447,010 is a continuation of U.S. Pat. No. 4,855,718 and discloses a modification wherein digital color signals from a computer are each input to a TTL buffer amplifier, which in turn outputs a digital color signal that is attenuated prior to being applied to the extended cable. At the keyboard and monitor, the received, attenuated signals are each passed across a termination network and then applied to an open-ended Schmitt-triggered buffer amplifier for reconstructing the digital video signals. Again, no provision is made to actively pull up or pull down the signal in the extended line while providing increased noise damping near the switching thresholds.

Patent application Ser. No. 07/488,710 is a continuation of patent application Ser. No. 07/447,010 and discloses a modification wherein transistors in signal conditioning networks are used to modulate current flow in the extended cable to provide analog video signals to an analog color monitor. Here, the signals ar attenuated prior to being applied to the extended cable so as to reduce or eliminate radiated noise and reconstructed prior to being applied to the analog monitor. No attempt is made to actively pull up or pull down the attenuated clock and keyboard signals while providing increased noise damping.

Patent application Ser. No. 07/555,580 discloses three embodiments of a system for extending computer communications utilizing precompensating networks for shaping digital signals opposite to the effects of attenuation effected by the cable prior to applying them to the extended cable and reconstructing networks for receiving the signals and reconstructing them prior to applying them to the monitor. These systems utilize complex arrangements of filtering and wave shaping networks, none of which involve the technique of actively pulling up or pulling down an attenuated signal in the manner of the instant invention while providing increased noise damping at voltage transition points.

Accordingly, it is an object of this invention to provide circuitry for actively pulling up or actively pulling down an attenuated signal, reconstructing received digital signals from an extended conductor of a conventional cable up to 1,500 feet in length, and having a plurality of adjacent signal conductors wherein the received signals are attenuated by the conductor and roll-off filters to a point where they are virtually unusable as received and are laden with induced noise, particularly digital video noise.

SUMMARY OF THE INVENTION

An extended range communications system is disclosed for open-collector digital circuitry wherein at least one conductor in a cable up to about 1,500 feet in length conveys digital signals from a digital switching device coupled to an end of the cable. The digital device switches between a normally "high" logic potential and a lower potential representing a "low," impressing "high" and "low" digital transitions at one end of the conductor of the cable, with these logic signals being attenuated upon reaching the other end of the conductor.

For obtaining digital-quality transitions and voltage levels from the attenuated transitions, and for reducing the induced noise, a signal conditioning network is coupled to receiving ends of the conductor to condition the attenuated signals and provide the digital transitions and voltage levels to the peripherals coupled to the cable. This signal conditioning network consists of a non-inverting amplifier having "on" and "off" voltage thresholds, for switching the amplifier to an "on" or "off" logic state responsive to the attenuated signal crossing the thresholds. In addition, in an "off" logic state, the amplifier provides a low impedance to ground to the conductor, shunting potential on the conductor to a ground potential. A feedback resistor coupled between an input and output of each amplifier which, in conjunction with a source of current-limited potential, provides increasing current flow to the conductor as the transition potential approaches the thresholds in positive and negative going directions. This increasing current flow dampens induced noise on the conductor as the transitions approach and cross the thresholds, eliminating false data signals and insuring that the data voltage levels are sufficient.

BRIEF DESCRIPTION OF THE DRAWINGS

FIG. 1 is a schematic illustration of a system incorporating the present invention.

FIG. 3 is a schematic diagram containing three embodiments of the present invention.

FIG. 7 is a fourth embodiment of the present invention.

FIG. 8 is a fifth embodiment of the present invention.

DETAILED DESCRIPTION OF THE PREFERRED EMBODIMENT

Figure 2:
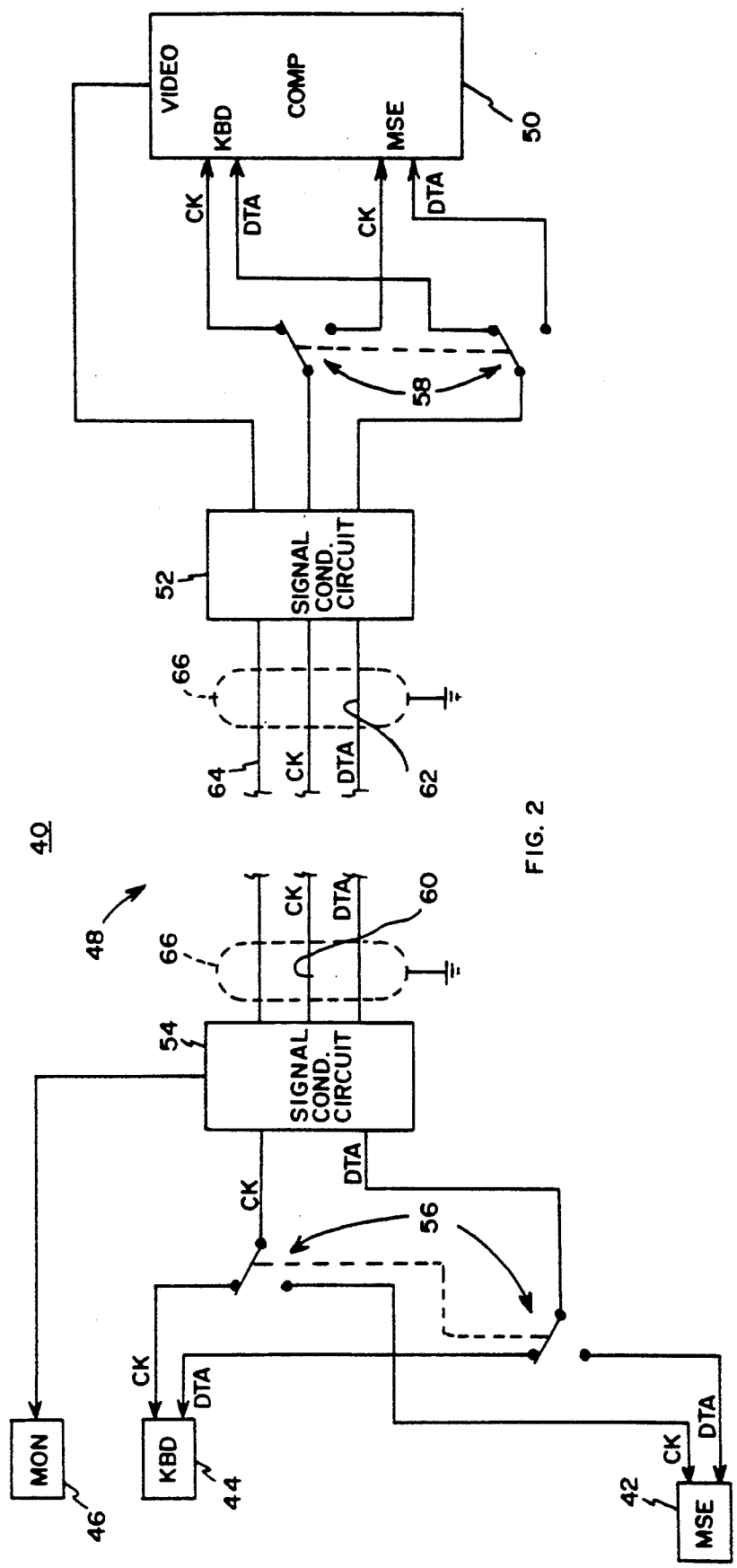
FIG. 2 is a schematic illustration of circuitry containing the present invention.

Referring initially to FIG. 1, illustrating the instant invention in its simplest form, digital data is produced in a digital device 12 (dotted lines), such as a keyboard, with the data typically passed from the device by applying the data to a base input 13 of an output transistor 14, typically located in an output driver integrated circuit. Transistor 14 has an emitter 16 coupled to ground and a collector 18 coupled to a bias or pull-up resistor 20 coupled to bias power and an extended-in-length conductor 22 of up to 1,500 feet in length. Resistor 20 provides a current limited digital potential, such as +5 volts, to conductor 22, which potential is maintained on conductor 22 when transistor 14 is switched "off." When transistor 14 is switched "on," the potential on conductor 22 is drained to ground via transistor 14, reducing the potential on conductor 22 to about 0.4 volts, or a logic "low" potential. In this manner, digital "high" and "low" transitions are applied to one end of conductor 22.

At the other end of conductor 22, a receiving device 24, such as a computer, receives the "high" and "low" transitions. As conductor 22 and roll-off filter 26 attenuates the high frequency components and amplitude of the digital signals, this attenuation illustrated by high Z symbol 26, the digital signals must be restored with their high frequency components and original amplitude in order to be utilized. This is done by network 28, consisting of a conventional non-inverting buffer amplifier 30 having an input coupled to conductor 22, a feedback resistor 36 coupled between an output and input of buffer 30, and a bias resistor 34 coupled to the input of buffer 30 and conductor 22. Amplifier 30 is provided with an upper switching threshold at approximately 2 volts, at which a rising potential applied to the input of amplifier 30 causes the amplifier to provide a "high" logic potential on its output and also has a lower threshold at approximately 1 volt, at which a falling potential causes amplifier 30 to provide a "low" logic potential on its output. Also, a "low" potential on the amplifier output also provides a low impedance to ground, as illustrated by dashed lines inside these amplifiers. "Resistors 34 and 36 are selected to have a ratio of $R1/R2 \geq 1.875$, where R1 is resistor 34 and R2 is resistor 36." Coupled as such, a rising potential applied to conductor 22, as when transistor 14 is switched "off," causes increasing current flow via resistor 36 into the output of buffer 30, increasing noise damping effects as the transition is approached. As the rising potential crosses the upper, "on" threshold, amplifier 30 transitions to an "on" state, providing approximately 3.5 volts and current flow to conductor 22. The current flow is initially at a maximum level, maintaining the noise-damping effect with the current flow decreasing as the potential continues to increase to 3.5 volts. At this point, current flow from amplifier 30 is at a minimum, with current from resistor 34 providing an assisting, pull-up potential to conductor 22 to +5 volts.

Conversely, a falling potential on conductor 22, as when transistor 14 is switched "on," is resisted by current from resistor 34 down to 3.5 volts, at which point potential from amplifier 30 begins to provide current flow to conductor 22. This provides increasing noise damping as the potential continues to fall to 1 volt, at which point amplifier 30 switches to an "off" state, providing a low impedance to ground to conductor 22 and reversing current flow in resistor 36. This current flow is at a maximum immediately after amplifier 30 transitions, maintaining increased noise damping at the "low" switching threshold. The increased noise damping at the lower and upper thresholds provides sharp, noiseless digital transitions with digital rise and fall times, and resistor 34 provides additional potential to increase the attenuated signal such that device 24 is provided with good digital signals.

As an example of a long distance computer communications system, and referring to FIG. 2, a system 40 is shown for extending a "mouse," or X-Y transducer 42, an associated keyboard 44, and a monitor 46 by long distances, on the order of approximately 1,500 feet, by means of an extended-in-length cable 48 from a computer 50. A local signal conditioning circuit 52 is connected to cable 48 and computer 50 proximate computer 50 and receives bidirectional signals to/from computer 50 and cable 48 and passes video signals to cable 48. A remote signal conditioning circuit 54 is coupled to cable 48 proximate the keyboard, mouse, and monitor and receives signals from cable 48, keyboard 44, mouse 42, routes them in the appropriate direction, and passes video signals to the monitor. A multiplexing device, represented by switches 56 and 58, multiplexes clock and data signals from mouse 42 and keyboard 44 and applies the multiplexed signals to clock and data conductors 60 and 62, respectively, of cable 48.

While signal conditioning circuits 52 and 54 are shown as discrete components, circuits 52 and 54 may be incorporated in the keyboard or mouse enclosures (not shown) or located in the enclosure housing computer 50 or housed in separate enclosures and coupled to the cable, computer, monitor, mouse, and keyboard by conventional cables and connectors. Cable 48 is a shielded conventional cable having a plurality of insulated conductors which are not twisted pairs, and which are generally positioned adjacent one another over the length of the cable and covered by a grounded, braided metallic shield 66 (dotted lines). Also, video signals from computer 50 to monitor 46 are transmitted through conductor 64 of cable 48 and conditioned by circuitry not shown.

In general, the mouse and keyboard contain open collector circuits as shown in FIG. 1, meaning that a "high" logic level is pulled "low" by logic components that sink current in the keyboard, mouse, or computer; and when the current sink is removed, the logic level reverts back to a normally "high" state. Thus, computer 50, keyboard 44, and mouse 42 all have normally "high" inputs, requiring these inputs be pulled "low" for data to be read.

Turning now to FIG. 3, three embodiments for signal conditioning circuits 52 and 54 are shown coupled to one of the conductors 60 or 62 in cable 16, although typically all of the conductors conveying digital signals over long distances would be provided with one of these embodiments at each end if the signals are bidirectional, or at the receiving end if unidirectional. The embodiment shown for signal conditioning circuit 52 is useful for a long conductor with substantial noise induced thereon, and the embodiment shown for circuit 54 is useful where there is a ground offset voltage present in addition to noise and attenuation by the long conductor. The third embodiment is shown as circuit 55 and is used primarily as a noise damper and may be centrally located in a long conductor in a similar manner as a signal booster. RC roll-off networks 70 and 72 are provided at each end of conductor 60, 62 for attenuating the signals transmitted over the conductor in order to reduce radiated noise from the cable as per FCC Part 15 requirements. These filters, in addition to the length of the conductors in cable 48, further attenuate digital signals to a point where induced video noise, in the form of transient spikes or surges, can cause false triggering of logic components in the keyboard, mouse, and computer. The combined impedances due to inductance, capacitance, resistance, and the effects of roll-off filters 70 and 72 are shown in FIG. 3 as impedance symbols 74 positioned at each end of conductor 60, 62.

Output buffers of mouse 42 and keyboard 44 and computer 50 are symbolized by transistors 76 and 78, these transistors having their bases coupled via a resistor to output logic devices (not shown) of the mouse, keyboard, and computer in bidirectional configuration. Collectors of transistors 76 and 78 are coupled to conductor 60, 62 and a pull-up resistor 80, which provides potential for the normally "high" logic state on conductor 60, 62. Emitters of transistors 76 and 78 are coupled to ground or in the described "open collector" configuration. The input of buffer 82 of keyboard 42 and mouse 44 is coupled to the collector of transistor 76 and receives signals from conductor 60, 62. Likewise, the input of buffer 84 of computer 50 receives signals from conductor 60, 62, which is coupled to the collector of transistor 78 and provides logic signals to the computer. Connected as such, when either or both of transistors 76 and 78 are switched "on," the potential on conductor 60, 62 drops to a "low" voltage level, which is the combined voltage of the 200 millivolt drop across transistors 76 and 78 and the drop across the impedance of conductor 60, 62. This "low" level ideally should be no more than 400 millivolts for TTL devices, but induced video noise and ground offsets at either end of conductor 60, 62 may cause this ground potential to exceed volt, a voltage level that prevents buffers 82 and 84 from transitioning "low." When transistors 76 and 78 are switched "off," pull-up resistors 80 provide a +5 volt potential to conductor 60, 62, which potential may not actually reach +5 volts due to losses in conductor 60, 62.

In a typical case, for an extended cable of approximately 500 feet or less, networks in the signal conditioning circuits at each end of conductor 60, 62 are constructed as shown for network 52 and consist of a non-inverting TTL buffer amplifier 86, a feedback resistor 88 coupled as shown between inputs and outputs of amplifier 86 and to conductor 60, 62, and a pull-up resistor 90 coupled to conductor 60, 62. Buffer amplifier 86, as stated, is provided with a turn-on threshold at approximately 2 volts wherein a positive going transition crossing the turn-on threshold switches amplifier 86 "on," and a turn-off threshold at approximately 1 volt wherein a negative-going transition crossing the turn-off threshold switches amplifiers 86 "off." These networks function to insure that data levels attenuated by RC networks 70 and 72 and the extended-length run of conductor 60, 62 swing sufficiently to trigger buffers 82 and 84 in the mouse, keyboard and computer and provide current flow to or from conductor 60, 62 before amplifier 86 transitions to dampen transient noise spikes such that false triggerings in the mouse, keyboard and computer do not occur.

The extent to which network 52 suppresses noise and provides current flow in conductor 60, 62 is due to the values of resistances selected for resistors 88 and 90. Accordingly, network 52, when pulled "low" by a "low" on conductor 60, 62, stays "low" until the "low" is removed and then reverts of its own accord, independent of the potential on conductor 60, 62, to a "high" logic level. In other words, as network 52 is released from a "low" logic state, and without current from pull-up resistors 80, resistor 90 is sized having a resistance to provide enough current to the output of amplifier 86 via resistor 88, which in turn is sized to provide less current than resistor 90 to overcome the current drop at the output of amplifier 86 and raise the voltage level on the input thereof to above the switching threshold of about 2 volts, transitioning amplifier 86 from a "low" to a "high" logic state.

Figure 4:
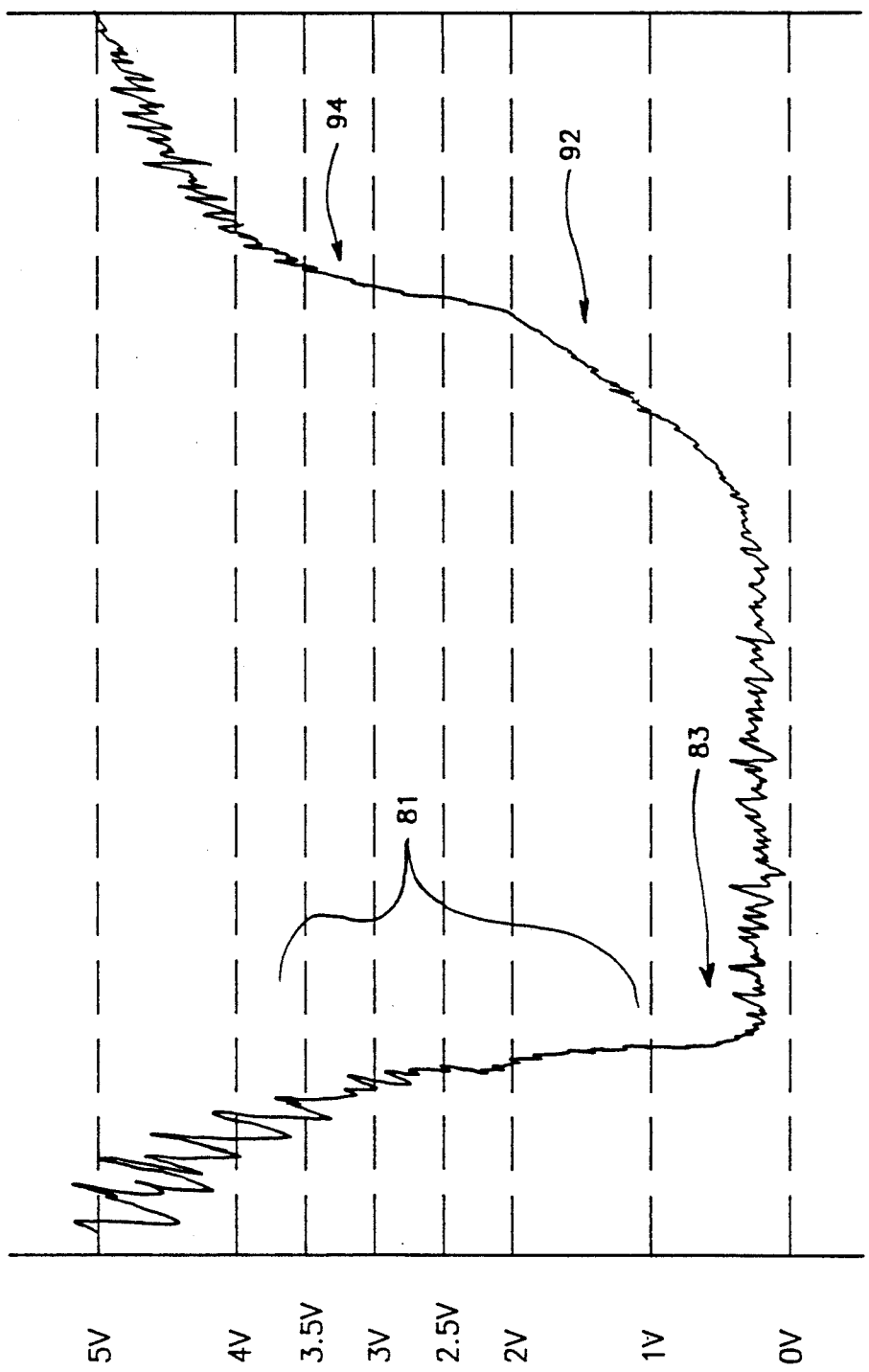
FIG. 4 is a waveform of a digital signal modified by one embodiment of the present invention.

With network 52 coupled to conductor 60, 62 as shown, an attenuated, noisy, negative-going transition on conductor 60, 62, as shown in the waveform of FIG. 4 drops from approximately 5 volts or slightly lower to about 3.5 volts, the upper level of the output of amplifier 86, at which point amplifier 86 begins to provide current flow to conductor 60, 62 via resistor 88, providing an increasing noise damping effect as the "off" threshold is approached, as illustrated by portion 81 of the waveform of FIG. 4. While the output of amplifier 86 remains at 3.5 volts, current flow through resistor 88 increases as the potential on conductor 60, 62 continues to drop. This current combines with current from pull-up resistor 90 to provide increased noise damping on conductor 60, 62. As the voltage continues to drop, it crosses the lower 1 volt threshold of amplifier 86, switching amplifier 86 "off" and lowering its TTL low level. At this point, the operation of amplifier 86 changes from resisting the falling potential to assisting in pulling the signal "low," decreasing the fall time for portion 83 of the negative-going transition on conductor 60, 62 and insuring that the falling potential drops to a standard, reduced noise, TTL level. As amplifier 86 transitions "low," current flow from conductor 60, 62 is at its maximum, and as the potential continues to drop, current flow decreases. This insures that the "low" applied to buffer 82 reaches a stable, near-ground potential and the negative-going transition at the "off" 1 volt threshold is generally free of noise. While in the "off" logic state, signal line fluctuations due to noise or other perturbing factors which may cause erroneous bit states are dampened by current flow to the low impedance output in amplifier 86 via feedback resistor 88.

For a positive-going transition, with amplifier 86 at a "low" logic level, pull-up resistor 90 supplies current to conductor 60, 62 and to the grounded output of amplifier 86 via feedback resistor 88, damping induced noise and stabilizing the signal on conductor 60, 62 as described. As one or both of transistors 76 and 78 are switched "off," removing the current sink from conductor 60, 62, and the potential on conductor 60, 62 begins to rise, the grounded output of amplifier 86 sinks increasing current via feedback resistor 88, damping noise to an increasing extent as shown for leading edge 92 of the waveform of FIG. 4. As current flow from conductor 60, 62 increases, pushing the voltage on the input of amplifier 86 above approximately 2 volts, the upper switching threshold for TTL devices, amplifier 86 switches from a "low" to a "high" state, causing the output thereof to reverse the function of sinking current to providing current to the signal line, acting as a pull-up device while effectively damping noise at the "on" threshold. The waveform then exhibits a sharp, noise-free leading edge 94 to about 3.5 volts which, when applied to buffer 82 of the mouse or keyboard, produces a transition without false triggering. Thus, the function of amplifier 86 changes from a noise-damping pull-down device to a noise-damping pull-up device, and vice versa, depending on the direction of transition of the signal.

In this open collector environment where it is desired that a normally "high" logic level is to be maintained, the "stiffness" or rapidity of which rise and fall times of the logic levels may be modified and degree of noise damping at the thresholds is adjusted by adjusting the values of resistors 88 and 90. Importantly, this relates to the length of extended cable 48; for a shorter cable, increasing resistances of resistors 88 and 90 reduces the "stiffness" of the network 52 and reduces damping by providing less current flow to the signal lines and amplifier 86. Conversely, for longer cable lengths, the values of resistors 88 and 90 are reduced, providing more noise damping current flow to the signal lines and amplifiers 86. In general, values of 2.2K ohms for feedback resistor 88 and 1.8K ohms for pull-up resistor 90 provide a good balance between overloading of components and providing too little pull-down or pull-up in digital voltage ranges, although lower values down to 780 ohms for feedback resistor 88 and 680 ohms for pull-up resistor 90 have been demonstrated to be workable in conjunction with standard TTL integrated circuit designs. These latter values are suitable where a low signal-to-noise ratio or where video noise in a particularly long cable is encountered. Alternately, noise on conductors 60, 62 may be capacitively coupled to the base of a transistor (not shown) biased to operate in its operating region, with this transistor and associated components being substituted for resistors 88 and 90. This would provide a variable resistance for resistors 88 and 90, in accordance with a variable noise level, thereby automatically varying "stiffness" of the network 52. It is noted here that network 52 described above may be incorporated in any digital open-collector circuit where noise and/or long cable runs are considerations or where it is necessary to "clean up" digital signals or to modify signal rise and fall times. Additionally, while TTL circuitry is disclosed herein, operational amplifiers (not shown) and comparators (not shown) provided with feedback may be used in place of buffer amplifiers 86 where larger voltage swings such as +12 volt to −12 volt or +12 volt to −5 volt or the like are encountered.

Figure 5:
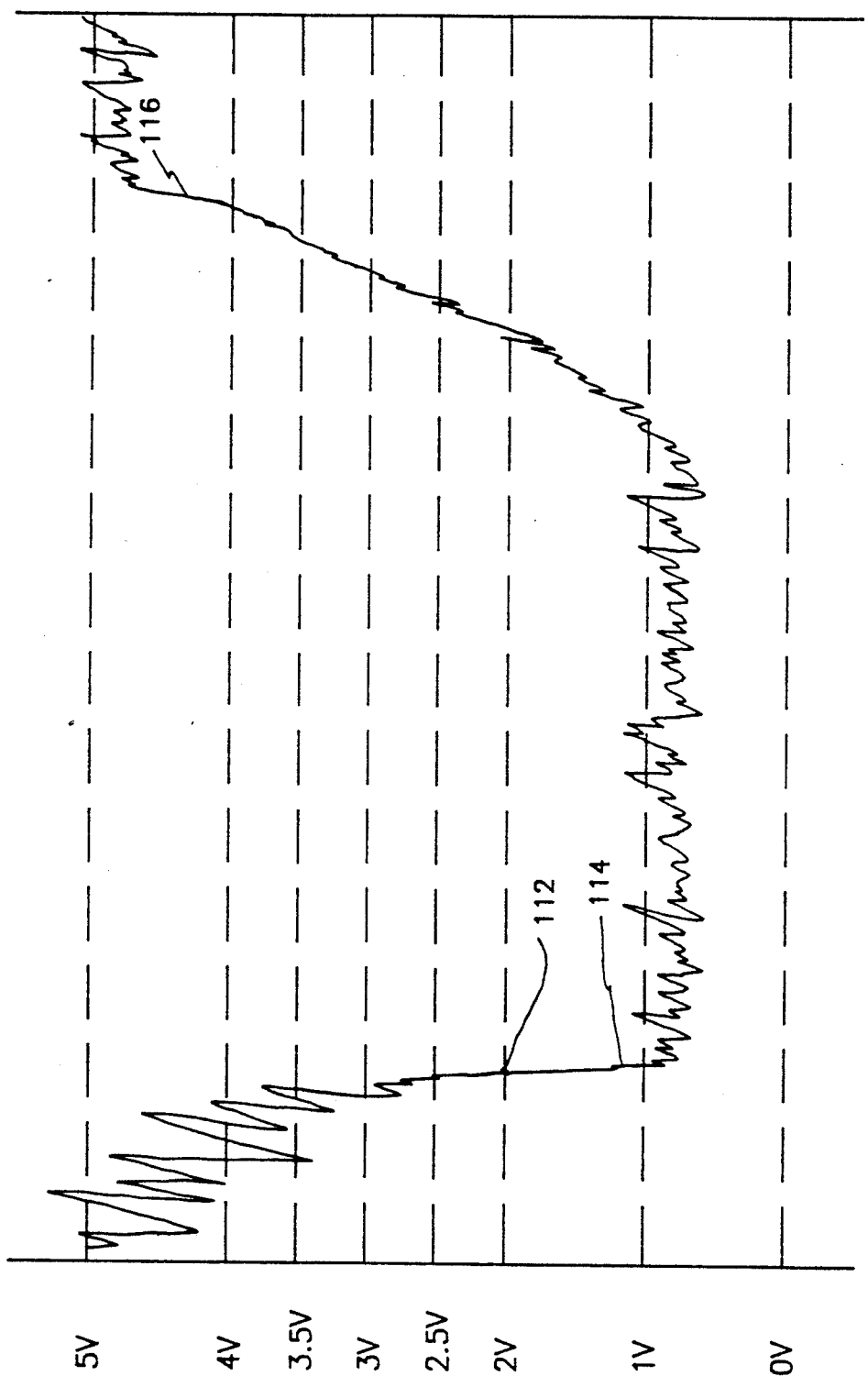
FIG. 5 is a waveform of a digital signal modified by a second embodiment of the present invention.

In the instance where a voltage offset in the ground conductor is present, the embodiment shown in FIG. 3 for network 54 is utilized. Here, a voltage divider network 102 consisting of resistors 104 and 108 having values, by way of example, of about 1K ohms for resistor 104 and about 500 ohms for resistor 108 divide the voltage applied to the input of amplifier 106 from conductor 60, 62 so as to provide a voltage offset such that the voltage applied to the input of amplifier 106 reaches 1 volt when the voltage on conductor 60, 62 reaches approximately 2 volts. This effectively counteracts any ground voltage offset and large noise spikes that may occur on conductor 60, 62. As shown in FIG. 5, the waveform from network 54, for a negative-going transition, initially is displaced slightly due to pull-up resistor 110, and as the falling voltage reaches about 2 volts at point 112, amplifier 106 transitions "low" and applies a current sink to conductor 60, 62, which pulls the voltage thereon "low," as seen by falling edge 114. As stated, noise on this waveform, especially at the thresholds, is greatly suppressed by the current sinking action of network 54, with the "low" being in the less-than 400 millivolt for TTL devices. When the "low" is released, as by transistor 78 being biased "off," amplifier 106, in conjunction with resistor 104 coupled to ground, sinks current until voltage on conductor 60, 62 rises above 4 volts, at which point amplifier 106 transitions to a "high" logic state, as shown by rising edge 116 of the waveform of FIG. 5. While a 2:1 offset is illustrated, it is noted that any offset up to about 2.25 volts may be utilized to offset an elevated ground potential, as long as the rising potential from the voltage divider network exceeds the 3.5 volt upper threshold to allow the amplifier to transition "high".

Figure 6:
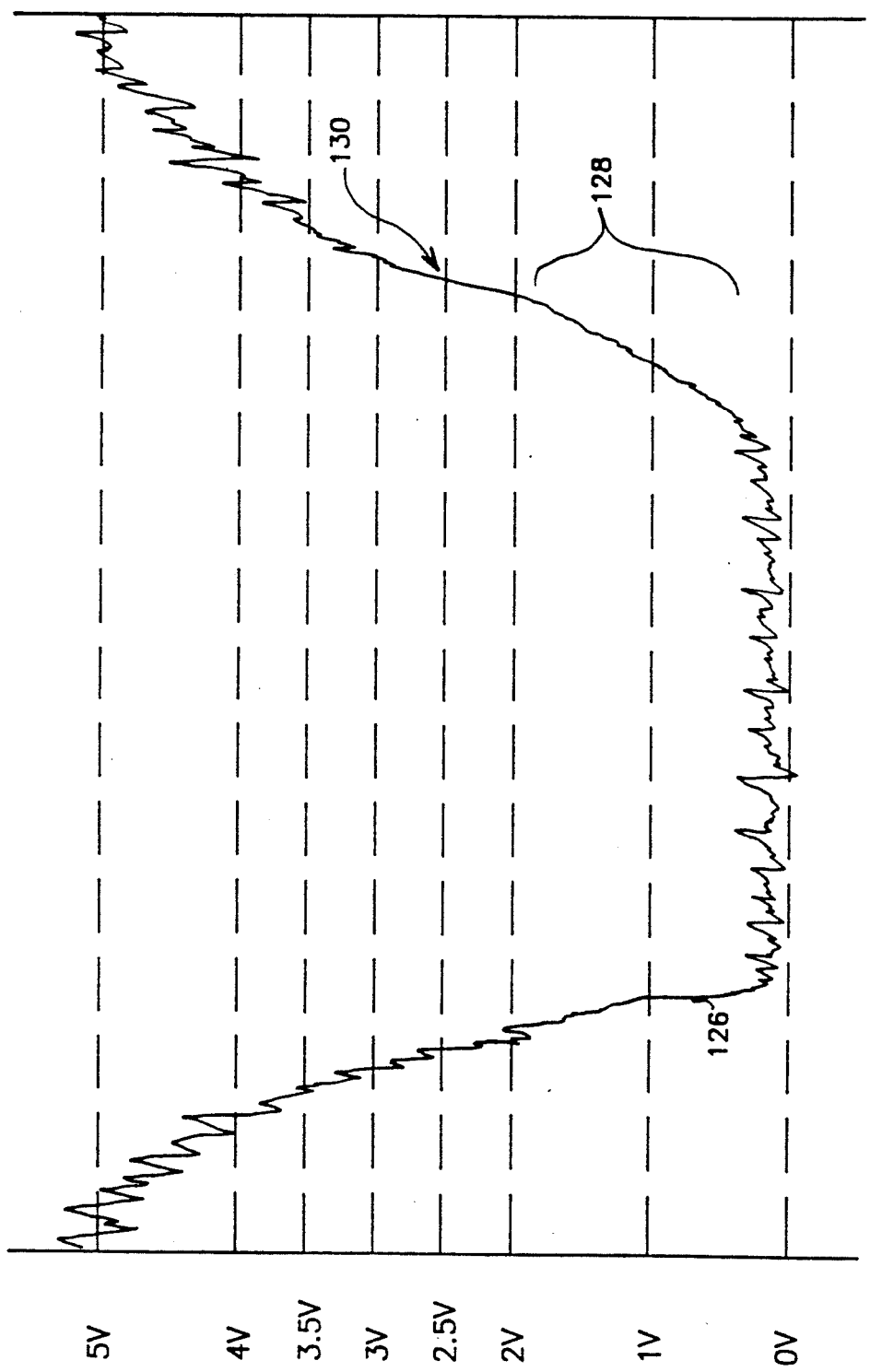
FIG. 6 is a waveform of a digital signal modified by a third embodiment of the present invention.

In the third embodiment shown by network 55 of FIG. 3, the pull-up resistor is omitted. This network serves as a noise spike damper by providing either current or a ground to conductor 60, 62 and is contemplated to be centrally coupled to conductor 60 62 in the manner of signal booster. Here a negative transition on conductor 60, 62 produces the waveform shown in FIG. 6. Initially, the original waveform is displaced slightly because amplifier 122 provides increasing current via resistor 124 to conductor 60, 62 down to 1 volt, at which point amplifier 122 transitions, sinking current from conductor 60, 62 and producing a fast falling edge 126. When the waveform begins to rise, amplifier 122 sinks increasing current flow, providing increasing damping and producing the displaced portion 128 until reaching 2 volts, at which point amplifier 122 transitions "high"At this point, amplifier 122 provides a maximum current flow, producing the fast rising edge 130, with the damping current flow decreasing as the potential approaches about 3.5 volts, after which the waveform is pulled to about 5 volts by pull-up resistors 80.

In the alternate embodiments shown in FIGS. 7 and 8, diodes 130 and 140 are included in networks 132 and 142 for providing only current sink assists or current source assists. In FIG. 7, diode 130, in series with resistor 134, is oriented such that when the signal line transitions from a "high" to a "low" logic level, buffer amplifier 136 transitions at its threshold of approximately 1 volt and sinks current from conductor 60, 62 and resistor 138 via diode 130 and resistor 134. This embodiment provides noise damping and increases speed of a falling transition only. In FIG. 8, a pull-up assist is provided by including a diode 140 oriented as shown in network 142 to provide current from amplifier 144 to a rising transition, providing speed and noise damping thereto while having no effect on a falling transition.

In accordance with the foregoing, it is apparent that the applicant has provided signal conditioning networks that enables long distance transmission of mouse and keyboard signals over conventional cables the order of at least 1,500 feet to a computer. These networks effectively provide noise-free transitions and insure stable data levels and ground levels on transmission lines of a length heretofore unusable for digital, and particularly TTL, signals.

After having described my invention and the manner of its use, it is apparent that minor modifications may be made thereto that fairly fall within the scope of the following appended claims.

I claim:

1. A low noise extended range communications system for transmitting digital signals via an extended cable having at least one conductor with respect to a conductive reference and disposed for conveying the digital signals, comprising:

a source of digital signals;

a source of electrical potential coupled to said conductor, for impressing said potential on said conductor with respect to said conductive reference;

at least one switching means having an input adapted for receiving said digital signals, and a first switched terminal coupled to one end of said conductor and a second switched terminal coupled to said conductive reference, for opening and closing a circuit between said conductor and said conductive reference responsive to discrete ones of said digital signals, causing HIGH and LOW potential transitions to occur on said conductor; and at least one signal conditioning network coupled to said conductor comprising:

a non-inverting amplifier having an input coupled to said conductor, and an output, and further having a HIGH voltage threshold and a LOW voltage threshold, a positive feedback resistive device coupled between said input and said output of said amplifier, and a source of current commonly coupled to said input of said amplifier and to said conductor, wherein, as a falling voltage potential on said conductor approaches said LOW voltage threshold, current flow, and corresponding noise damping on said conductor, from said amplifier and said source of current, increases to a peak level, at which level said amplifier changes logic state to a LOW state, drawing a peak current flow from said conductor and from said source of current to said amplifier output, maintaining peak noise damping, and as said potential continues to fall, away from said LOW threshold, current flow and said corresponding noise damping decreases, and then as a rising voltage potential occurs on said conductor and approaches said HIGH threshold, current flow, and said corresponding noise damping, from said conductor and from said source of current to said amplifier output increases to a maximum level, at which level said amplifier changes to a HIGH logic state, providing maximum current flow, and maximum noise damping, to said conductor from said amplifier output and said source of current, and as said rising voltage potential continues to increase away from said HIGH threshold, said current flow and said corresponding noise damping decreases.

2. An extended range communications system as set forth in claim 1 wherein said source of current comprises a pull-up resistor coupled to a power source.

3. An extended range communications system as set forth in claim 2 wherein a resistance of said pull-up resistor is between about 680 ohms and 1.8K ohms, and a resistance of said positive feedback resistive device is between about 780 ohms and 2.2K ohms.

4. An extended range communications system as set forth in claim 1 wherein said non-inverting amplifier is a TTL buffer amplifier.

5. An extended range communications system as set forth in claim 1 wherein said source of current comprises a voltage divider network for providing a reduced potential from said conductor and applying said reduced potential to said input of said amplifier, increasing a potential on said conductor at which said amplifier is triggered "on" and "off".

6. An extended range communications system as set forth in claim 5 wherein said voltage divider network is sized to provide up to 2.25 volts for a 5 volt potential on said conductor.

7. An extended range communications system as set forth in claim 1 comprising a diode coupled in series with said positive feedback resistive device, said diode oriented to pass current from siad output of said amplifier to said conductor, providing increased noise damping as said decreasing voltage transition approaches said "off" threshold.

8. An extended range communications system as set forth in claim 1 comprising a diode coupled in series with said positive feedback resistive device, said diode oriented to pass current from said conductor to said output of said amplifier, providing increased noise damping as said increasing voltage transition approaches said "on" threshold.

9. An extended range communications system as set forth in claim 1 wherein said extended cable extends up to approximately 1,500 feet.

10. A low noise, extended range communications system for transmitting digital signals via an extended cable having at least one conductor with respect to a conductive reference, and disposed for conveying the digital signals, comprising:
   a source of digital signals;
   a source of electrical potential coupled to said conductor, for impressing said potential on said conductor with respect to said conductive reference;
   at least one switching means having an input adapted for receiving said digital signals, and having a first switched terminal coupled to one end of said conductor and a second switched terminal coupled to said conductive reference, for opening and closing a circuit between said conductor and said conductive reference responsive to discrete ones of said digital signals, causing HIGH and LOW potential transitions to occur on said conductor;
   at least one signal conditioning network coupled to said conductor comprising:
     a non-inverting amplifier having an input coupled to said conductor, and an output, and further having a HIGH voltage threshold and a LOW voltage threshold,
     a positive feedback resistive device having first and second ends, said first end coupled to said input of said amplifier and said second end coupled to said output of said amplifier, and
     a resistor having first and second ends, said first end coupled to a power source and said second end coupled in common to said input of said amplifier, said first end of said positive feedback resistive device, and to said conductor,
   wherein, as a falling voltage potential on said conductor approaches said LOW voltage threshold, current flow, and corresponding noise damping on said conductor, from said amplifier and said source of current increases to a peak level, at which level said amplifier changes logic state to a LOW state, drawing a peak current flow from said conductor and from said source of current to said amplifier output, maintaining peak noise damping, and as said potential continues to fall, away from said LOW threshold, current flow and said corresponding noise damping decreases, and as a rising voltage potential on said conductor approaches said HIGH threshold, current flow, and said corresponding noise damping, from said conductor and from said source of current to said amplifier output increases to a maximum level, at which level said amplifier switches state, providing maximum current flow, and maximum noise damping, to said conductor from said amplifier output and said source of current, and as said rising voltage potential continues to increase away from said HIGH threshold, said current flow and said corresponding noise damping decreases.

11. A low noise extended range communications system for transmitting digital signals via an extended cable having at least one conductor with respect to a conductive reference, and disposed for conveying the digital signals, comprising:
   a source of digital signals;
   a source of electrical potential coupled to said conductor, for impressing said potential on said conductor with respect to said conductive reference;
   at least one switching means having an input adapted for receiving said digital signals, and a first switched terminal coupled to one end of said conductor and a second switched terminal coupled to said conductive reference, for opening and closing a circuit between said conductor and said conductive reference responsive to discrete ones of said digital signals, causing HIGH and LOW voltage transitions to occur on said conductor;
   a non-inverting amplifier having an input coupled to said conductor, and an output, and further having a HIGH voltage threshold and a LOW voltage threshold;
   a positive feedback resistive device coupled between said input and said output of said amplifier; and
   a voltage divider network having a mid point commonly coupled to said input of said amplifier and to said conductor, for reducing a potential from said conductor and applying said reduced potential to said input of said amplifier, increasing a potential at which said amplifier is triggered HIGH and LOW;
   wherein, as a falling voltage potential on said conductor approaches said LOW voltage threshold, current flow, and corresponding noise damping, from said amplifier and said source of current increases to a peak level, at which level said amplifier changes logic state to a LOW state, drawing a peak current flow from said conductor and said source of current to said amplifier output, maintaining peak noise damping, and as said potential continues to fall, away from said LOW threshold, current flow and said noise damping decreases, and as a rising voltage potential on said conductor approaches said HIGH threshold, current flow, and said corresponding noise damping, from said conductor and said source of current to said amplifier output increases to a maximum level, at which level said amplifier switches state, providing maximum current flow, and maximum noise damping, to said conductor from said amplifier output and said source of current, and as said rising voltage potential continues to increase away from said HIGH threshold, said current flow and said corresponding noise damping decreases.

12. An extended range communications system as set forth in claim 11, wherein said voltage divider network is sized to provide up to 2.25 volts to said input of said amplifier for a 5-volt potential on said conductor.

13. A low noise extended range communications system for transmitting digital signals via an extended cable having at least one conductor with respect to a conductive reference, and disposed for conveying the digital signals, comprising:
 a source of digital signals;
 a source of electrical potential coupled to said conductor, for impressing said potential on said conductor with respect to said conductive reference;
 at least one switching means having an input adapted for receiving said digital signals, and a first switched terminal coupled to one end of said conductor and a second switched terminal coupled to said conductive reference, for opening and closing a circuit between said conductor and said conductive reference responsive to discrete ones of said digital signals, causing HIGH and LOW voltage transitions to occur on said conductor; and
 at least one signal conditioning network coupled to said conductor comprising:
  a non-inverting amplifier having an input coupled to said conductor, and an output, and further having a HIGH voltage threshold and a LOW voltage threshold;
  a diode and a positive feedback resistive device coupled in series between said input and said output of said amplifier, for allowing current to flow only in one direction between said input and said output of said amplifier, and
  a source of current commonly coupled to said input of said amplifier and to said conductor,
 wherein, as a falling voltage potential on said conductor approaches one of said LOW and HIGH voltage thresholds, current flow, and corresponding noise damping, to or from said amplifier and said source of current increases to a peak level, at which level said amplifier changes logic state, drawing a peak current flow from two sources of current flow, maintaining peak noise damping, and as said potential continues to move away from one of said thresholds, current flow, and said corresponding noise damping, decreases, providing increased noise damping proximate to and on either side of one of said thresholds.

* * * * *